United States Patent
Wu

(10) Patent No.: US 8,553,742 B1
(45) Date of Patent: Oct. 8, 2013

(54) LASER CHIP PACKAGE STRUCTURE

(71) Applicant: Hon Hai Precision Industry Co., Ltd., New Taipei (TW)

(72) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/757,008

(22) Filed: Feb. 1, 2013

(30) Foreign Application Priority Data

Dec. 26, 2012 (TW) .................................. 101149941

(51) Int. Cl.
*H01S 3/00* (2006.01)
*H01S 3/08* (2006.01)
*G02B 6/42* (2006.01)

(52) U.S. Cl.
USPC .............................. 372/107; 372/38.1; 385/92

(58) Field of Classification Search
USPC .......................... 385/92; 372/38.1, 38.08, 107
See application file for complete search history.

(56) References Cited

U.S. PATENT DOCUMENTS

2003/0142929 A1* 7/2003 Bartur et al. .................... 385/92

\* cited by examiner

*Primary Examiner* — Armando Rodriguez
(74) *Attorney, Agent, or Firm* — Altis & Wispro Law Group, Inc.

(57) ABSTRACT

A laser chip package structure includes a printed circuit board (PCB), a flexible circuit board, a laser chip and a number of electronic elements. The PCB includes a supporting surface. The flexible circuit board is positioned on the supporting surface and electrically connected to the PCB. The laser chip is positioned on the flexible circuit board and electrically connected to the flexible circuit board. The laser chip is configured to emit a laser beam. The electronic elements are positioned on the flexible circuit board and electrically connected to the flexible circuit board.

12 Claims, 2 Drawing Sheets

LASER CHIP PACKAGE STRUCTURE

BACKGROUND

1. Technical Field

The present disclosure relates to chip package structures, and particularly to a laser chip package structure.

2. Description of Related Art

Laser chip package structures include a printed circuit board (PCB) and at least one laser chip positioned on the PCB. The laser chip includes a number of plug pins inserted in the PCB to electrically connect to the PCB. To achieve predetermined functions, bonding wires are utilized to electrically connect the laser chip to the plug pins and transmit high-frequency signals between the laser chip and the plug pins. However, a large inductance is introduced and increases signal loss at the bonding wires when transmitting the high-frequency signals. In addition, with the development of technology, such laser chip package structures also need to satisfy requirements of compactness and low cost. However, due to narrow space in the laser chip package, the requirements are hard to achieve.

What is needed therefore is a laser chip package structure which can overcome the above-mentioned limitations.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
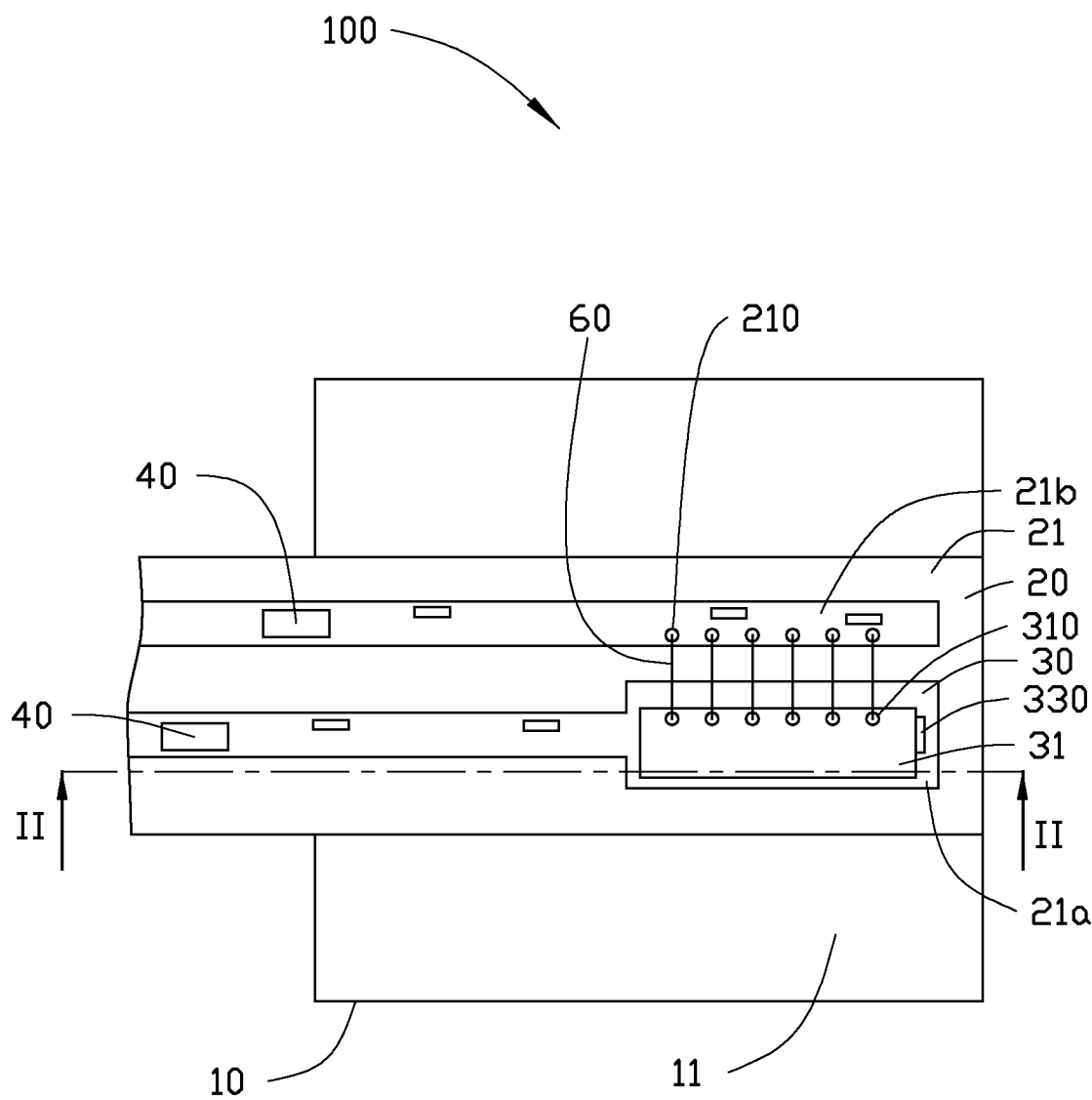
FIG. 1 is a schematic view of a laser chip package structure, according to an exemplary embodiment.
Figure 2:
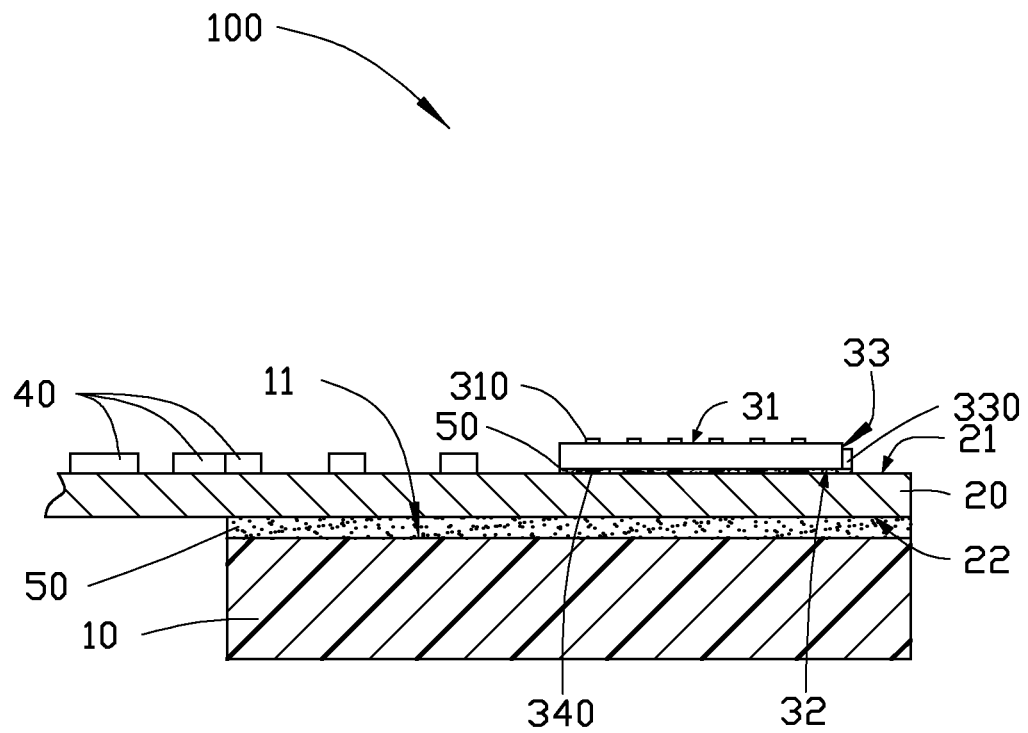
FIG. 2 is a cross-sectional view taken along line II-II of FIG. 1.

FIGS. 1-2 show a laser chip package structure 100, according to an embodiment. The laser chip package structure 100 includes a printed circuit board (PCB) 10, a flexible circuit board 20 positioned on the PCB 10, a laser chip 30 and a number of electronic elements 40. The laser chip 30 and the electronic elements 40 are positioned on and electrically connected to the flexible circuit board 20.

The PCB 10 includes a supporting surface 11 for supporting the flexible circuit board 20, the laser chip 30 and the electronic elements 40.

The flexible circuit board 20 is substantially rectangular-shaped, and positioned on the supporting surface 11 of the PCB 10. The flexible circuit board 20 includes a top surface 21 and a bottom surface 22 facing away from the top surface 21.

In the embodiment, the bottom surface 22 is positioned on the supporting surface 11 through an electric adhesive 50. Therefore, the flexible circuit board 20 is electrically connected to the laser chip 30 through the electric adhesive 50. In the embodiment, for enhancing a heat dissipation of the laser chip package structure 100, the electric adhesive 50 is a silver colloid. Alternatively, the electric adhesive 50 also can be anisotropic conductive film. The top surface 21 includes a first bonding area 21a and a second bonding area 21b. The first bonding area 21a is substantially parallel with the second bonding area 21b. The first bonding area 21a and the second bonding area 21b are spaced by a distance. The flexible circuit board 20 includes a number of first bonding pads 210 formed on the second bonding area 21b of the top surface 21. The first bonding pads 210 connect to circuits (not shown) formed in the flexible circuit board 20.

The electronic elements 40 are positioned on the first bonding area 21a and the second bonding area 21b of the top surface 21 and electrically connected to the flexible circuit board 20.

The laser chip 30 includes an upper surface 31, a lower surface 32 facing away from the upper surface 31, and a side surface 33. The upper surface 31 is substantially parallel with the lower surface 32. Both the upper surface 31 and the lower surface 32 are substantially perpendicular to the side surface 33. The lower surface 32 is positioned on the top surface 21 through the electric adhesive 50.

The laser chip 30 includes a number of second bonding pads 310 forming on the upper surface 31 and a number of third bonding pads 340 forming on the lower surface 32. The second bonding pads 310 and the third bonding pads 340 connect to circuits (not shown) formed in the laser chip 30. The laser chip package structure 100 further includes a number of bonding wires 60. The bonding wires 60 each electrically connect a first bonding pad 210 to a corresponding second bonding pad 310, as such: the laser chip 30 is electrically connected to the flexible circuit board 20. The bonding wires 60 are made from a material(s) with high conductivity. In the embodiment, the bonding wires 60 are made from gold. The third bonding pads 340 are electrically connected to the first bonding area 21a of the flexible circuit board 20 by the electric adhesive 50.

The laser chip 30 also includes a light emitting portion 330 which is positioned on the side surface 33 and is configured to emit laser beams.

In other embodiments, the flexible circuit board 20 can be positioned on the supporting surface 11 by electric adhesive, plastic welding or other attaching methods.

In other embodiments, the laser chip 30 can be positioned on the flexible circuit board 20 by electric adhesive, plastic welding or other attaching methods.

In other embodiments, the laser chip 30 can be mechanically and electrically connected to the flexible circuit board by a package process, for example, chip-scale, wafer-level chip-scale, ceramic leaded, plastic leadless chip, thermal compression bonding, or a flip chip packaging process.

The laser chip package structure 100 uses the flexible circuit board 20 to electrically connect the laser chip 30 to the PCB 10, thus an inductance between the laser chip 30 and the PCB 10 is decreased. In addition, the flexible circuit board 20 can provide more extra space to position more electronic elements 40.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. A laser chip package structure, comprising:
a printed circuit board (PCB) comprising a supporting surface;
a flexible circuit board positioned on the supporting surface and electrically connected to the PCB, the flexible circuit board comprising a top surface and a bottom surface facing away from the top surface, the top surface comprises a first bonding area;

a laser chip positioned on the flexible circuit board and electrically connected to the flexible circuit board, the laser chip configured to emit laser beams, the laser chip comprising an upper surface and a lower surface facing away from the upper surface, the laser chip comprising a plurality bonding pads forming on the lower surface; and a plurality of electronic element positioned on the flexible circuit board and electrically connected to the flexible circuit board, wherein the bonding pads are electrically connected to the first bonding area of the flexible circuit board.

2. The laser chip package structure of claim 1, wherein the flexible circuit board is substantially rectangular-shaped.

3. The laser chip package structure of claim 1, wherein the laser chip comprises a side surface, and the laser chip comprises a light emitting portion which is positioned on the side surface and is configured to emit the laser beams.

4. The laser chip package structure of claim 3, wherein the lower surface is positioned on the top surface of the flexible circuit board through an electric adhesive, the upper surface is substantially parallel with the lower surface, and both the upper surface and the lower surface are substantially perpendicular to the side surface.

5. The laser chip package structure of claim 4, further comprising a plurality of bonding wires, wherein the top surface comprises a second bonding area, the flexible circuit board comprises a plurality of first bonding pads formed on the second bonding area, the laser chip comprises a plurality of second bonding pads forming on the upper surface, the bonding wires each electrically connects a respective one of the first bonding pads to a respective one of the second bonding pads.

6. The laser chip package structure of claim 5, wherein the bonding wires are made from a material with high conductivity.

7. The laser chip package structure of claim 6, wherein the bonding wires are made from gold.

8. The laser chip package structure of claim 5, wherein the bottom surface is positioned on the supporting surface through the electric adhesive.

9. The laser chip package structure of claim 5, wherein the bonding pads are electrically connected to the first bonding area of the flexible circuit board by the electric adhesive.

10. The laser chip package structure of claim 9, wherein the electric adhesive is a silver colloid.

11. The laser chip package structure of claim 9, wherein the electric adhesive is anisotropic conductive film.

12. The laser chip package structure of claim 5, wherein the first bonding area is substantially parallel with the second bonding area, the first bonding area and the second bonding area are spaced by a distance.

* * * * *